United States Patent [19]

Nami et al.

[11] Patent Number: 5,337,893
[45] Date of Patent: Aug. 16, 1994

[54] HIGH CAPACITY CARRIER PLATE

[75] Inventors: Robert B. Nami, San Diego; Edward A. Hamrick, Escondido; Jakob Herrmann, Carlsbad; Angelo M. Mitchell, San Marcos, all of Calif.

[73] Assignee: Electro Scientific Industries, Inc., Portland, Oreg.

[21] Appl. No.: 918,423

[22] Filed: Jul. 22, 1992

[51] Int. Cl.⁵ ............................................. B65D 73/02
[52] U.S. Cl. .................................. 206/329; 206/328; 118/503; 29/759; 29/760
[58] Field of Search ............... 206/329, 328, 331, 486; 118/500, 503; 269/900, 903; 29/759, 760

[56] References Cited

U.S. PATENT DOCUMENTS

| | | | |
|---|---|---|---|
| 3,414,962 | 12/1968 | Altamura | 29/760 |
| 3,641,666 | 2/1972 | Scaminaci, Jr. et al. | 29/760 |
| 3,653,411 | 4/1972 | Mosher et al. | 29/760 |
| 4,109,788 | 8/1978 | Hirose et al. | 206/329 |
| 4,381,321 | 4/1983 | Braden | 427/79 |
| 4,393,808 | 7/1983 | Braden | 118/503 |
| 4,395,184 | 7/1983 | Braden | 414/417 |
| 4,406,373 | 9/1983 | Braden | 209/574 |
| 4,502,094 | 2/1985 | Lewin et al. | 118/500 |
| 4,526,129 | 7/1985 | Braden | 118/503 |
| 4,598,821 | 7/1986 | LaBarbara et al. | 206/329 |
| 4,669,416 | 6/1987 | Delgado et al. | 118/503 |
| 4,788,931 | 12/1988 | Nitta et al. | 118/503 |
| 4,847,991 | 7/1989 | Higuchi | 29/759 |
| 4,859,498 | 8/1989 | Yamaguchi | 269/903 |
| 4,903,393 | 2/1990 | Higuchi | 29/450 |
| 4,920,915 | 5/1990 | Senda et al. | 118/503 |
| 4,928,821 | 5/1990 | Belko, Jr. | 206/329 |
| 4,953,283 | 9/1990 | Kawabata et al. | 118/503 |
| 4,970,781 | 11/1990 | Chang et al. | 29/760 |
| 5,007,534 | 4/1991 | Tamaki et al. | 206/329 |

FOREIGN PATENT DOCUMENTS

| | | |
|---|---|---|
| 0014119 | 8/1980 | European Pat. Off. |
| 61-50365 | 11/1986 | Japan |
| 2-83913 | 3/1990 | Japan |
| 3-76778 | 12/1991 | Japan |

*Primary Examiner*—David T. Fidei
*Attorney, Agent, or Firm*—Stoel Rives Boley Jones & Grey

[57] ABSTRACT

Generally planar component carrier plates and loading plates include a framework having a perimeter portion and an interior portion having an array of component passageways. A resilient layer is positioned parallel to the interior portion and is provided with component apertures collinear with corresponding component passageways for resiliently gripping components. The component carrier and loading plates are non-rectangular, and have three or more axes of symmetry in the plane of the framework. Component carrier and loading plates are also provided with handling and alignment bores and recesses.

30 Claims, 4 Drawing Sheets

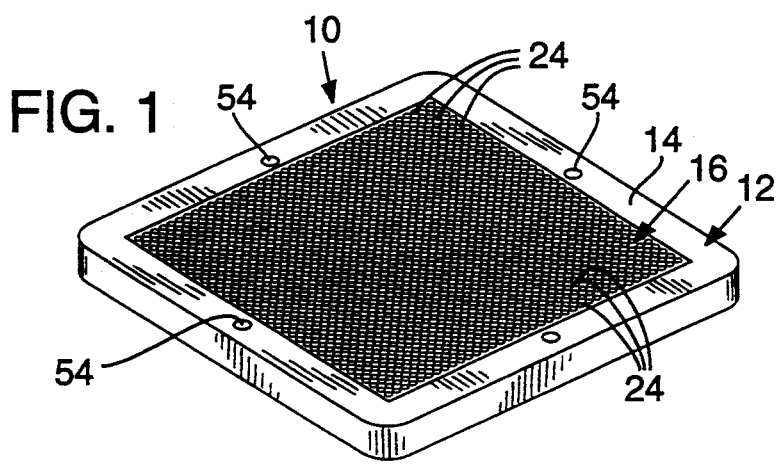
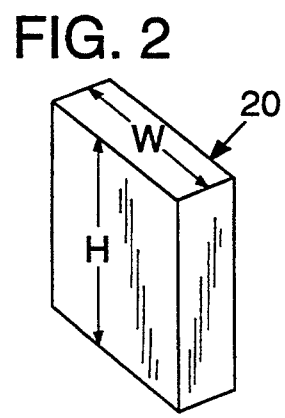
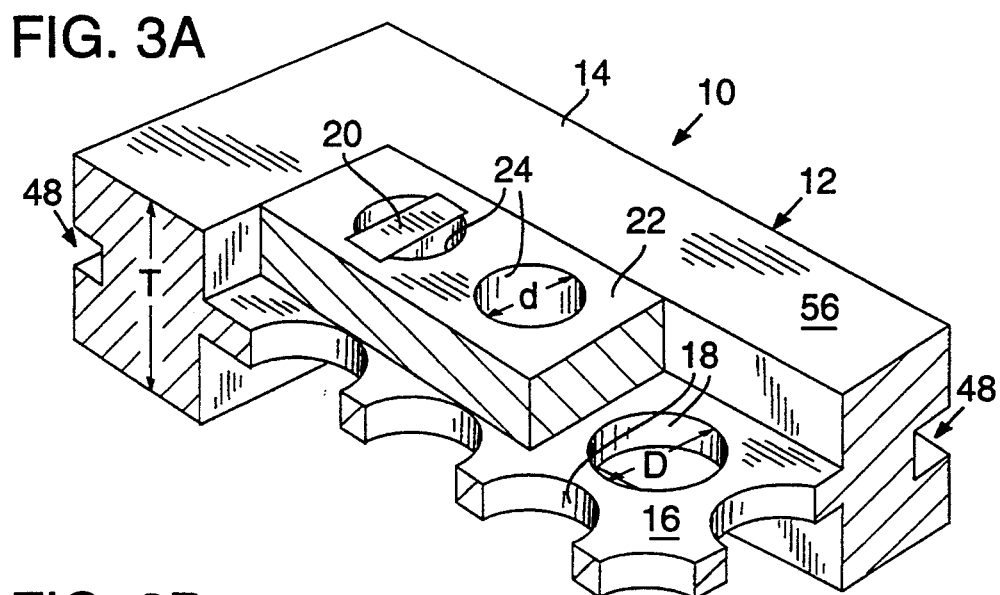
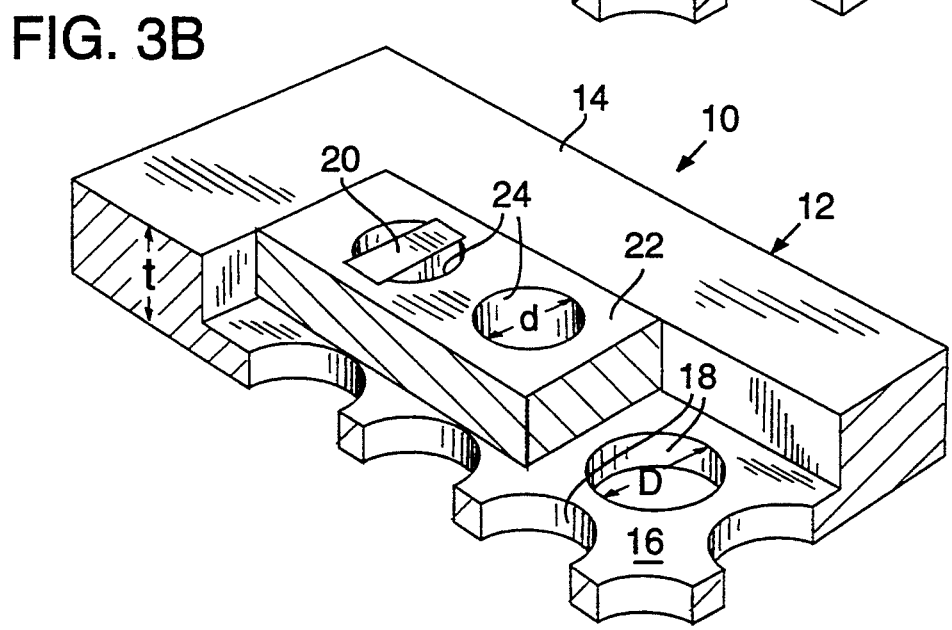

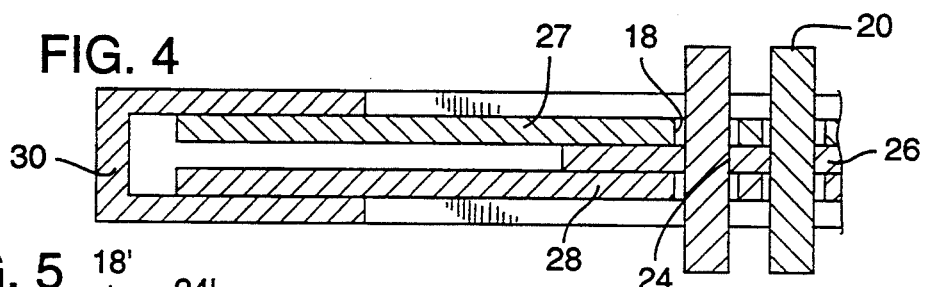
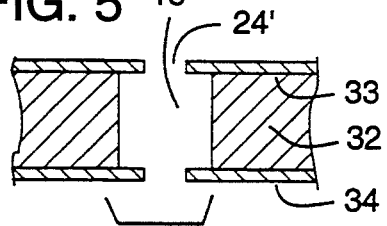
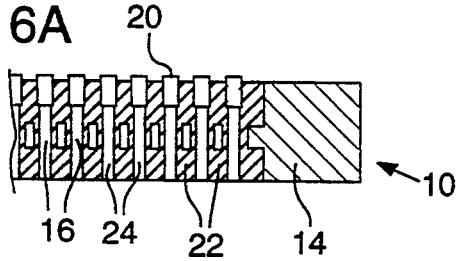
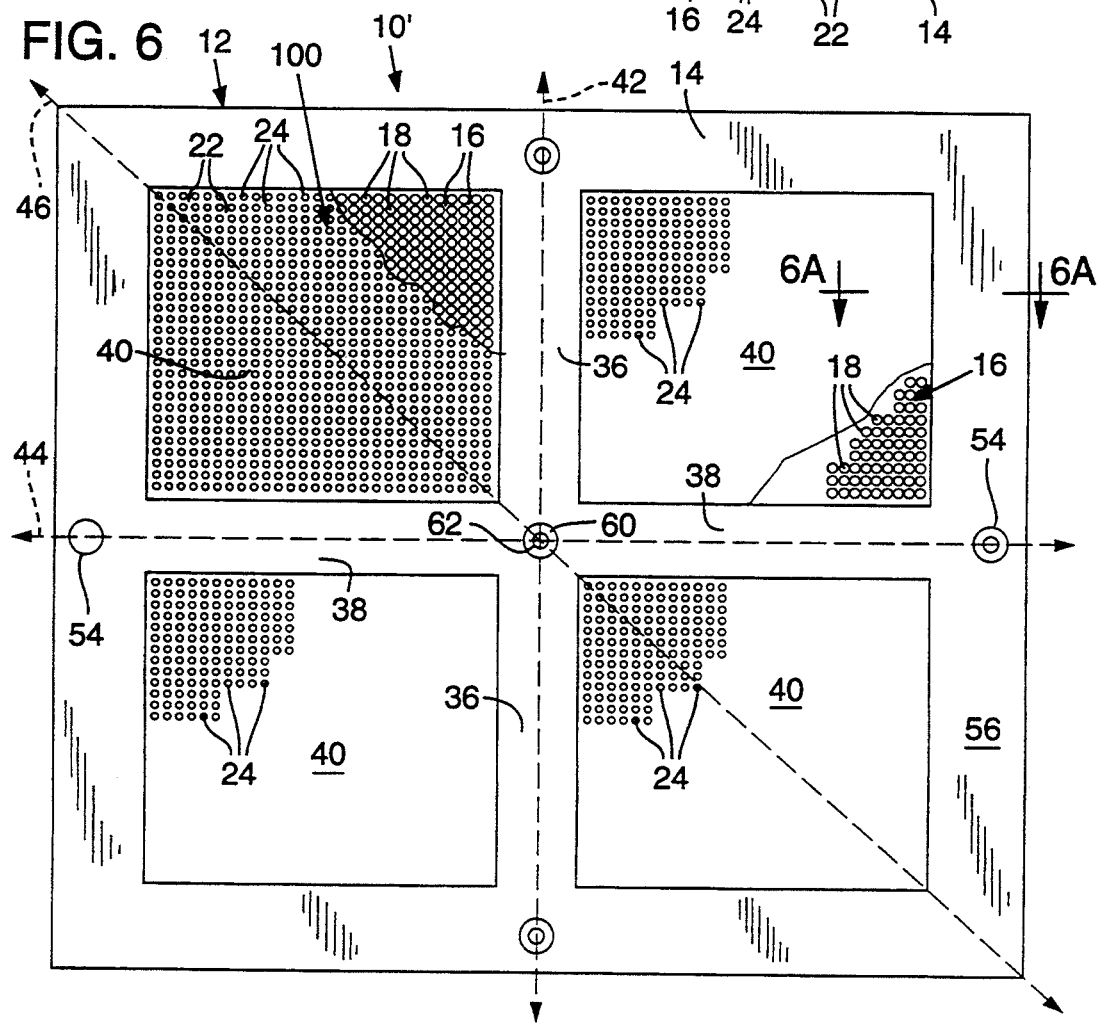

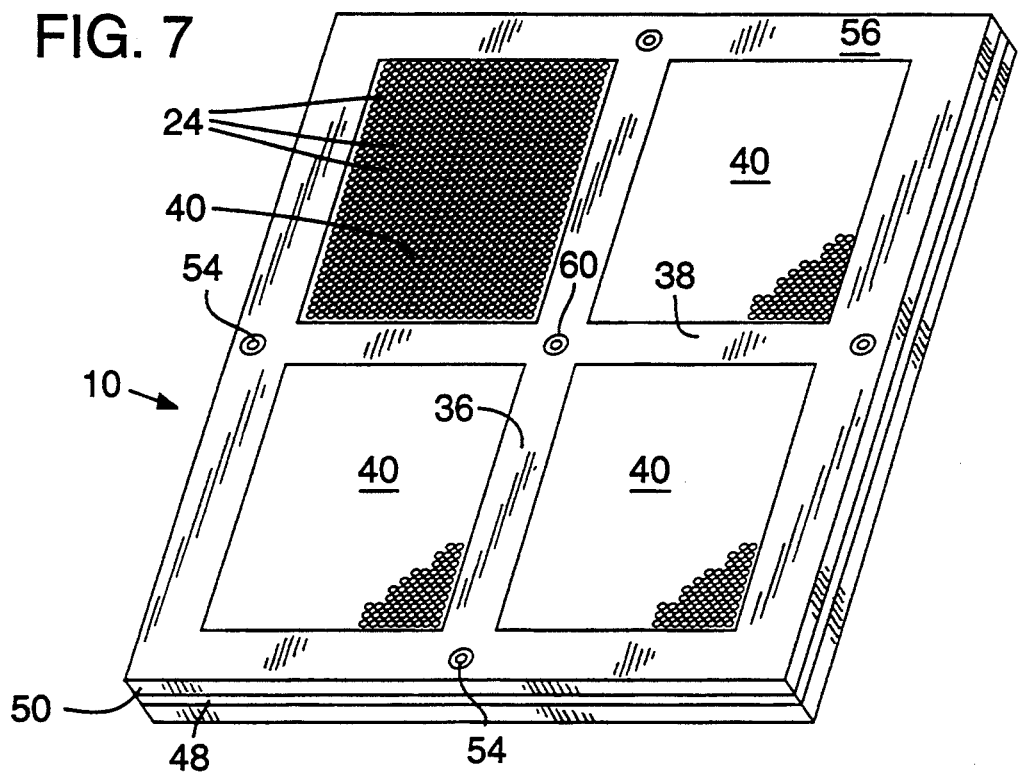
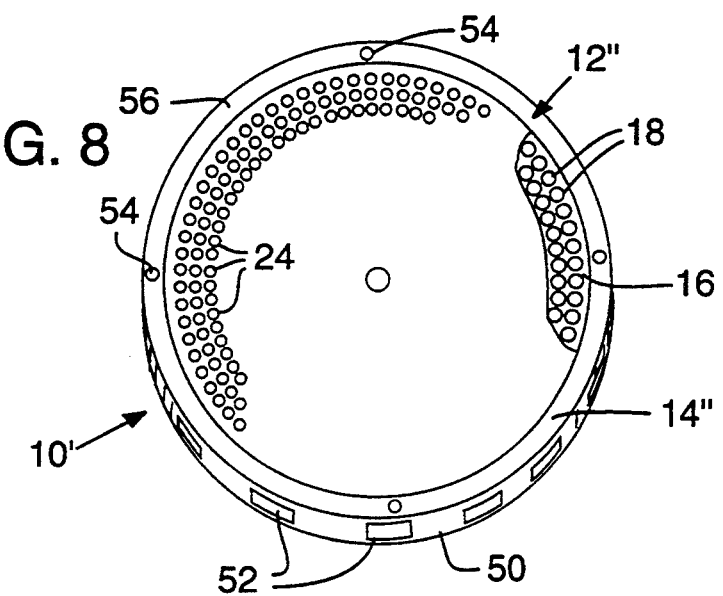
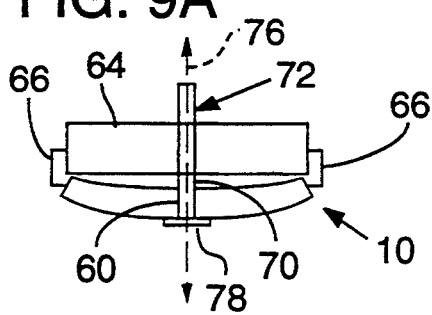
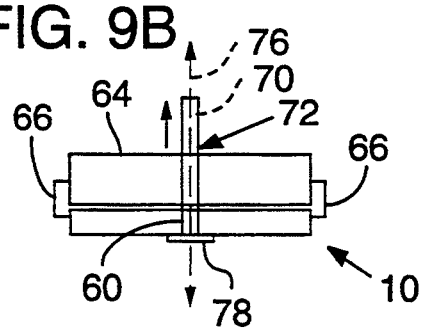

HIGH CAPACITY CARRIER PLATE

TECHNICAL FIELD

The present invention relates generally to carrier plates for securing miniature electronic components such as capacitors and resistors during transport, storage and/or processing operations.

BACKGROUND OF THE INVENTION

Various devices, systems and methods have been used to transport, handle and process miniature electronic components such as capacitors and resistors. Miniature electronic components are generally square, rectangular or cylindrical and are typically loaded into a part-handling plate or carrier plate for handling and processing as a batch. Various types of processing operations are performed while components are mounted in carrier plates. For example, external electrodes may be applied to opposite ends of chip components mounted in carrier plates using component termination techniques described in U.S. Pat. Nos. 4,788,931; 4,395,184; 4,381,321; 4,526,129; and Japanese Patent Publication Nos. 61-50365 and 2-83913.

Conventional carrier plates are rectangular and have an array of apertures for resiliently holding miniature components. Carrier plates are substantially rigid to facilitate loading, handling and processing operations, yet the apertures for holding individual components provide resilient gripping means that hold components in a random or predetermined orientation during loading, transport and processing operations. Several different carrier plate designs have been proposed.

Conventional carrier plates are described in U.S. Pat. Nos. 4,526,129; 4,381,321; 4,395,184; and 4,393,808. These carrier plates comprise a rigid metallic plate with a multiplicity of component passageways arranged in an array. The interior portion of the plate is coated with a resilient material such as silicon rubber or a resilient polymeric material that coats both surfaces of the plate and additionally coats the interior surfaces of the passageways. The resilient coating on the walls of the component passageways extends from face to face of the coated plate. The component apertures through the compliant material have slightly smaller dimensions than those of the electronic components, so that the resilient material grips components continuously when they are loaded in the plate. The length of each resilient aperture is greater than the maximum length of parts to be handled using the plate. Various carrier plates are provided for components having different dimensions. In general, each carrier plate has an array of uniformly-sized apertures.

Japanese Patent Publication No. 2-83913 describes a carrier plate similar to those described above, except that the carrier plate has a thickness less than that of the longest dimension of the electronic components. When electronic components are loaded into this type of carrier plate, opposite ends of the components project from opposed surfaces of the carrier plate. This permits modification of various processing techniques.

U.S. Pat. No. 4,598,821 teaches a carrier plate for holding miniature electronic components wherein an elastic sheet is interposed between and bonded to two rigid metallic or plastic plates to form a laminated assembly. A frame is mounted around the laminated assembly. Holes in the elastic sheet are smaller than and centrally aligned with respect to corresponding holes in the rigid plates. The thickness of the laminated assembly is less than the maximum length of parts to be handled so that loaded components project from both surfaces.

U.S. Pat. No. 4,928,821 discloses a carrier plate comprising a rigid base plate having an array of openings and a sheet of elastomeric, resilient material removably attached to one or both surfaces of the base plate. The elastomeric sheet has openings in alignment with but smaller than those of the base plate to resiliently hold electronic components for transport, processing, or the like. The openings in the elastomeric material have slits so that when components are inserted into the carrier plate, the resilient openings can expand to substantially the same dimensions as those of the components.

A composite carrier plate incorporating a central compliant member interposed between two rigid plates and aligned using a spacer component is disclosed in U.S. Pat. No. 4,669,416. The central compliant member may be removed and replaced as necessary.

Japanese Patent Publication No. 61-50365 discloses a method for terminating resistors using a plate body consisting of an elastic silicon rubber. The plate body is provided with an array of apertures for receiving resistors to be terminated. The elastic plate body is thinner than the thickness of the resistors.

Japanese Patent Publication No. 3-76778 discloses a flexible material composed of organopolysiloxanes and a platinum compound employed as the resilient material in carrier plates. The flexible material purportedly has advantageous adhesive and dimensional tolerance properties.

Although conventional carrier plates generally provide satisfactory resilient holding means, they require costly high precision fabrication and assembly techniques. The resilient coating material degrades over time, and such degradation may be hastened by exposure to certain chemicals, fumes, light, repeated thermal cycling and the like. Moreover, sharp edges and corners of electronic components may damage the resilient material coating the carrier plate apertures during loading and manipulation of components in the carrier plates. Furthermore, because components are typically loaded into the carrier plates in the same orientation, the resilient coating becomes worn and loses its resiliency in areas where it repeatedly contacts component edges and corners.

Reconstruction of worn or damaged carrier plates involves removal and replacement of all of the resilient material and is a time intensive and expensive process. Carrier plates are generally treated as a consumable item and worn carrier plates are simply discarded. Substantial efforts have therefore been directed to providing carrier plates having prolonged useful lives.

Component loading systems have been developed to load and align a plurality of components simultaneously in all of the apertures of a carrier plate. As described in U.S. Pat. No. 4,526,129, components are typically loaded into carrier plates using a vibrator and vacuum device that draws components into the apertures formed by resilient material. A loading plate having an array of apertures corresponding to the array of apertures in the carrier plate is typically used to prealign the components for loading into the carrier plate. Loading or holding plates having various configurations are described, for example, in U.S. Pat. Nos. 4,903,393 and 4,847,991.

Conventional carrier plates are rectangular and have dimensions of about 5×9 inches and 7×11 inches. The size and pattern of apertures varies, depending upon the dimensions of components. Most commercial carrier plates have on the order of about 300 to 5,300 individual component apertures arranged in an array. Component loading and processing apparatus is adapted to match the size and configuration of the carrier plate apertures and requires adjustment each time a carrier plate having a different configuration is used.

Since electronic components are typically handled and processed in batch fashion, increases in throughput are generally attributable to reductions in the time required for a particular processing operation, or to conventional processing of larger batches. For most component processing operations, the processing time is substantially the same, regardless of the number of components in the batch.

There are limitations, however, on the dimensions and configurations of carrier plates and the processing equipment adapted to hold and manipulate loaded carrier plates. Carrier plates larger than the conventional rectangular plates are prone to excessive warpage, even during routine handling and processing operations. Warpage may be even more pronounced as a result of repeated thermal cycling of carrier plates. Use of warped carrier plates results in inaccurate component positioning and unsatisfactory component processing results. Moreover, for carrier plates that are coated with resilient material using various bonding techniques, larger surface area coverage requirements are difficult to achieve within prescribed tolerances.

There is thus a need in the art to provide improved carrier plates having enhanced component capacity that increases the overall component handling and processing throughput. Carrier plates having a prolonged useful life would also be desirable. Such improvements must be achieved without reducing the rigidity and structural integrity of the carrier plate.

SUMMARY OF THE INVENTION

Carrier plates of the present invention have a generally rigid, planar framework including a perimeter portion defining a geometric shape having at least three axes of symmetry in the plane of the framework. The framework also includes an interior portion having an array of component passageways, and a resilient layer arranged generally parallel to the interior portion of the framework and having an array of component apertures collinear with passageways in the interior portion for receiving and resiliently gripping electronic components. The rigid support and resilient layer(s) may be arranged in any of a variety of configurations described more fully below.

Carrier plates having a square configuration are especially preferred, but other symmetrical configurations may also be employed. A carrier plate having a square or otherwise symmetrical configuration permits handling of the carrier plate in conventional component processing systems in more than one orientation, and thereby prolongs the useful life of the carrier plate. Moreover, such carrier plates permit loading of components into carrier plates in a variety of orientations, thereby reducing wear on the resilient material coating the passageways. Conventional rectangular carrier plates cannot be manipulated in this fashion.

Carrier plates of the present invention preferably have alignment and plate-handling means positioned symmetrically in proximity to the perimeter portion to facilitate handling and processing operations. Bores may be provided for alignment purposes, and grooves or recesses may be provided to facilitate automated handling. The carrier plate preferably includes a continuous groove in the exterior edge of the perimeter portion to facilitate handling of the carrier plate in different degrees of rotation about the central axis. Likewise, symmetrically spaced recesses may additionally or alternatively be provided to facilitate handling. In addition, preferred carrier plates of the present invention have a central means adapted to cooperate with a warpage rectification means mounted on handling and/or processing equipment to correct warpage of the framework during handling of the carrier plate.

According to another aspect of the present invention, carrier plates also preferably include one or more structural ribs dividing the interior portion into a plurality of discrete component receiving sections having equivalent and symmetrical configurations. The ribs serve to reinforce the framework of the carrier plate and divide the interior component-handling portion of the carrier plate into smaller, identical arrays of apertures. The reduced dimensions of the discrete component receiving sections facilitate fabrication and assembly of carrier plates. Additionally, the ribs enhance the structural integrity and rigidity of the carrier plate and reduce the tendency of the plate to warp during handling and processing.

BRIEF DESCRIPTION OF THE DRAWINGS

Additional objects and advantages of the invention will be apparent from the following detailed description of preferred embodiments with reference to the accompanying drawings, in which:

FIG. 1 is a plan view of a carrier plate of the present invention having a square configuration;

FIG. 2 shows an enlarged isometric view of a miniature electronic component;

FIG. 3A is an enlarged fragmentary view, partly in section and with sections of resilient material removed, of one embodiment of a carrier plate of the present invention showing a component secured within an aperture;

FIG. 3B is an enlarged fragmentary view, partly in section and with sections of resilient material removed, of another embodiment of a carrier plate of the present invention;

FIG. 4 is an enlarged fragmentary sectional view illustrating another embodiment of the carrier plate of the present invention;

FIG. 5 is an enlarged cross-sectional view of an isolated component aperture according to yet another embodiment of the carrier plate of the present invention;

FIG. 6 is a plan view of a preferred carrier plate having structural ribs dividing the interior portion into discrete component receiving portions;

FIG. 6A is an enlarged cross-sectional view of a carrier plate having components loaded therein taken along line 6A—6A of FIG. 6;

FIG. 7 is an isometric view of a rectangular carrier plate of the present invention having discrete component receiving sections and a continuous groove in an exterior edge of the carrier plate;

FIG. 8 is an isometric view of a circular carrier plate of the present invention having symmetrically spaced recesses in the exterior edge of the carrier plate;

FIG. 9A is a side view of a carrier plate mounted in a handling or processing apparatus with a warpage rectification pin positioned through a central bore of the carrier plate;

FIG. 9B is a side view of a carrier plate as in FIG. 9A, after the warpage rectification pin has been adjusted to eliminate carrier plate warpage;

DETAILED DESCRIPTION OF PREFERRED EMBODIMENTS

Figure 10:
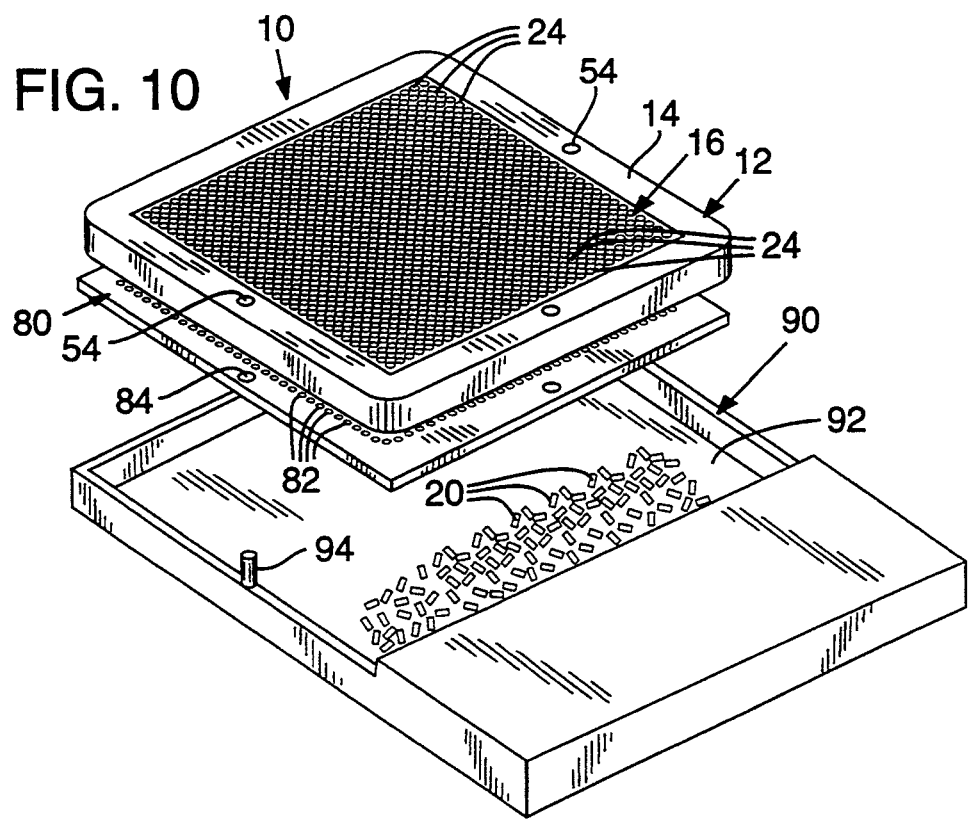
FIG. 10 is an exploded isometric view of a carrier plate, loading plate and loading apparatus in accordance with the present invention.

According to one aspect of the present invention, carrier plates having a non-rectangular configuration are provided. Carrier plates of the present invention preferably have a geometric shape having three or more axes of symmetry in the plane of the framework. Conceptually, such geometric shapes may, for example, be folded along three or more different axes in the plane of the framework to yield identical, overlapping sections. Rectangular carrier plates would not meet this requirement because they are not symmetrical about their diagonal axis. Square carrier plates (illustrated in FIGS. 1 and 6) are especially preferred, but circular carrier plates (illustrated in FIG. 9) and carrier plates having hexagonal or octagonal configurations, or the like, may also be employed. A preferred attribute of non-circular carrier plates of the present invention is that they have a geometric shape including three or more sides of equal length.

Carrier plates of the present invention having a non-rectangular configuration provide many operational advantages and have a longer useful life than their rectangular counterparts. Non-rectangular carrier plates of the present invention may be fabricated and assembled in accordance with any of the prior art teachings. Several specific carrier plate constructions are described in detail herein, but the invention is not limited to these constructions.

With reference to FIGS. 1, 3A and 3B, carrier plate 10 includes a framework 12 comprising a perimeter portion 14 and an interior portion 16. As shown in FIGS. 3A and 3B, at least one surface of interior portion 16 is preferably recessed with respect to perimeter portion 14. Perimeter portion 14 typically comprises an outer framework sized to provide structural rigidity and facilitate convenient handling of carrier plates fully loaded with components. It should be recognized, however, that perimeter portion 14 may have varying dimensions and that when the component passageways 18 in interior portion 16 approach the edges of the carrier plate, perimeter portion 14 represents the planar outer geometry of the carrier plate. Additionally, although perimeter portion 14 and interior portion 16 are illustrated as a one piece, integrated structure, interior portion 16 may be provided as a separate, plate-like structure capable of being securely mounted in perimeter portion 14.

A plurality of component passageways 18 penetrates interior portion 16 and forms an array. Component passageways 18 are illustrated as cylindrical bores, but they may have a rectangular or square configuration, a tapered configuration, or any other configuration that facilitates component handling. The dimensions (i.e. diameter, width, etc.) of component passageways 18 are typically greater than the largest areal dimension of components to be handled by the carrier plate. Thus, as illustrated in FIG. 3, the diameter "D" of component passageways 18 generally is greater than the largest areal width "W" of exemplary component 20 illustrated in FIG. 2. According to an alternative embodiment, however, the dimensions of component passageways 18 need not be sized to permit penetration of components. For certain types of handling and processing applications, it is desirable to provide passageways 18 that permit pins or other component positioning apparatus to penetrate but do not permit penetration of components themselves.

The array of component passageways 18 in interior portion 16 preferably has a perimeter configuration identical to that of the framework perimeter portion. That is, perimeter portion 14, interior portion 16, and the perimeter configuration of the array of component passageways 18 all have a geometric configuration having three or more axes of symmetry in the plane of the framework. Alternatively, the perimeter configuration of the array of component passageways may be different from that of the perimeter portion, but it may have the desired symmetry. Thus, for example, a square carrier plate may have an array of component passageways in a round configuration, or vice versa. The spacing of component passageways 18 is generally regular, but may vary depending upon the size of the passageways and the configuration of perimeter portion 14. In general, component passageways are as close together as is possible to provide a high capacity carrier plate, while maintaining the structural integrity and rigidity of the plate within acceptable levels and facilitating acceptable loading of components during loading operations. In general, offset row spacing wherein alternate rows of passageways are aligned is most desirable, but alternate arrangements may be preferred, depending upon the size of passageways and the dimensions of the components.

An important advantage of non-rectangular carrier plates of the present invention having three or more axes of symmetry in the plane of the framework is that such carrier plates can be rotated about central axis 62 (shown in FIG. 6) in the plane of the framework to permit presentation of the carrier plate in a plurality of distinct orientations for handling and processing applications. Repeated use of carrier plate 10 in a single orientation with conventional carrier plate loading apparatus causes each batch of electronic components to assume the same alignment or orientation within component apertures 24. Prolonged use results in wear and degradation of the resilient material where it is repeatedly contacted by component edges and corners. Rotation of a square carrier plate, as shown in FIG. 6, 90° about central axis 62 in the plane of the framework changes the orientation of components within component apertures and effectively doubles the useful life of the carrier plate. Alternative carrier plate geometries may further prolong the useful life of carrier plates. Conventional rectangular carrier plates generally cannot be manipulated in this fashion.

In the carrier plate construction illustrated in FIGS. 3A, 3B, 6 and 6A, a layer of resilient material 22 having a uniform thickness is provided on at least one of the surfaces of framework interior portion 16. According to the preferred embodiment illustrated in FIGS. 3A and 6A, resilient layer 22 is provided on each of the upper and lower surfaces of framework interior portion 16, although only one of the resilient layers is illustrated for purposes of clarity. In the embodiment illustrated in FIG. 3B, wherein only one of the surfaces of framework interior portion 16 is recessed with respect to perimeter portion 14, resilient layer 22 is provided only on the recessed surface.

Resilient layer 22 has a plurality of component apertures 24 aligned and collinear with component passageways 18 in framework interior portion 16. Component apertures 24 have generally the same configuration as component passageways 18, and are preferably generally cylindrical. Like component passageways 18, however, they may be square, rectangular, tapered, or the like to accommodate various component configurations. In the embodiment illustrated in FIGS. 3A and 6A, resilient layers 22 preferably penetrate component passageways 18 to provide a continuous resilient passageway extending from an exposed outer surface of one resilient layer to the exposed outer surface of the other resilient layer. In the embodiment illustrated in FIG. 3B, resilient material forming part of single resilient layer 22 need not penetrate component passageways 18 in framework interior portion 16.

Component apertures 24 preferably have a diameter "d" that is slightly less than the largest areal diameter (illustrated as "W" in FIG. 2) of components 20 to be handled by the carrier plate. This configuration ensures that components are securely retained in component apertures 24, as illustrated during processing and handling operations. The overall thickness of carrier plate 10, illustrated as "T" in FIG. 3A and "t" in FIG. 3B may be greater or less than the height "H" of component 20, depending upon desired component handling and processing applications. If the overall thickness of carrier plate 10 is less than the height "H" of component 20, components 20 may be mounted in the carrier plate so that opposite ends project from both surfaces of the carrier plate to facilitate certain processing operations. If the overall thickness of carrier plate 10 is greater than the height "H" of component 20, components are generally mounted with one end projecting from resilient layer 22, as illustrated in FIG. 6A.

FIGS. 4 and 5 illustrate alternative constructions for carrier plates having geometries specified according to the present invention. In the embodiment illustrated in FIG. 4, components 20 are retained in apertures in a resilient sheet 26 interposed between two rigid plates 27 and 28. Component apertures 24 in resilient sheet 26 are collinear with corresponding component passageways 18 in rigid plates 27 and 28, and are preferably smaller, as illustrated, to resiliently grip components. Resilient sheet 26 is preferably bonded to adjacent rigid plates, and a rigid framework 30 is provided to stiffen and secure the laminated assembly.

In the carrier plate embodiment illustrated in FIG. 5, rigid base plate 32 is interposed between resilient layers 33 and 34. Component passageways 181 in rigid base plate 32 are larger than corresponding component apertures 241 in resilient layers 33 and 34, as illustrated, so that resilient layers 33 and 34 positively grip components. Slits may be provided in the component apertures in resilient layers 33 and 34 to facilitate component gripping, as is known in the art.

Rigid framework members and plates described with reference to the carrier plates described above may be formed from rigid metals or rigid synthetic materials, as is known in the art. Aluminum is an especially preferred material. Technology for providing an array of apertures in such rigid materials is well known in the art and can be accomplished to precise tolerances. The material provided for gripping components is preferably resilient and durable, and suitable materials, including various rubber compositions and resilient polymeric materials are known in the art. Resilient materials such as the organopolysiloxane/platinum compositions disclosed in Japanese Patent Publication No. 3-76778 would also be suitable. The resilient material may be formed into a sheet material having an array of apertures and mounted on a rigid base, or various molding and injection techniques may be used to coat a rigid plate having an array of apertures with resilient material. Suitable fabrication techniques are well known in the art.

The carrier plate configurations illustrated in FIGS. 3-5 are merely illustrative. Carrier plates for storing, handling and processing electronic components having a variety of constructions and configurations may be adapted for use in accordance with the present invention. According to a first aspect of the present invention, any carrier plate having a non-rectangular configuration that is symmetrical about three or more axes of symmetry in the plane of the framework provides important advantages.

According to another aspect of improved carrier plates of the present invention, carrier plates 101 are effectively provided with multiple discrete interior portions by incorporation of one or more structural ribs, as illustrated in FIG. 6. Providing structural ribs in accordance with the present invention enhances the structural integrity and rigidity of the carrier plate and thereby reduces its tendency to warp during usage. Structural ribs that are integral with the framework structure are preferred, but separate ribs may be provided for attachment to a framework structure. Structural ribs may be incorporated in rectangular or non-rectangular carrier plates to provide improved structural integrity and durability.

In the embodiment illustrated in FIG. 6, carrier plate 101 is of the same general construction as the carrier plates illustrated in FIGS. 3A and 3B. The improved carrier plate includes a framework 12 having a perimeter portion 14 and an interior portion 16. Additionally, however, structural ribs 36 and 38 bisect the plate along two axes of symmetry to provide four discrete component receiving portions 40. Because carrier plate 10 illustrated in FIG. 6 has a square perimeter portion and because structural ribs 36 and 38 bisect the plate along axes of symmetry 42 and 44, respectively, each discrete component receiving portion 40 has a square configuration.

Although non-rectangular carrier plate configurations having geometric shapes that are symmetrical about three or more axes are preferred, this carrier plate improvement may be incorporated as well in rectangular carrier plates to improve their structural rigidity and reduce their tendency to warp. One or a plurality of ribs may be provided as required for various applications.

Structural ribs may have a variety of cross-sectional configurations and are, in general, larger in at least one dimension, than framework interior portion 16. According to preferred embodiments, structural ribs 36 and 38 have generally the same cross-sectional configuration as framework perimeter portion 14. Any number and configuration of structural ribs may be provided to enhance structural integrity and divide the interior portion into any number of discrete component receiving portions.

Positioning of structural ribs coincident with axes of symmetry 42 and/or 44 and/or 46 is especially preferred to provide symmetrical discrete component receiving portions 40 having identical configurations.

Each discrete component receiving portion 40 serves effectively as a carrier plate having a framework interior portion 16 with an array of component passageways 18 and a resilient layer 22 having an array of component apertures 24 coincident with component passageways 18. The full array of component passageways and component apertures has not been illustrated in FIG. 6 for purposes of clarity, but each array would be similar to the arrangement shown in FIG. 1, and the size and spacing of apertures may be as described above with reference to the carrier plates illustrated in FIGS. 3-5. The reduced size of discrete component receiving portions 40 permits greater flexibility in the process of coating framework 12 with compliant material 22. For example, other resilient materials having flow or curing properties not conducive to filling a larger array, could be employed. Smaller arrays 100 also enhance the alignment between apertures 18 and 24.

For certain applications, it may be desirable to provide a carrier plate as illustrated in FIG. 6, having one or more structural ribs, and a plurality of removable, replaceable, discrete component receiving portions 40. Various arrangements for removing, mounting and aligning individual component receiving portions having resilient component apertures are well known in the art and may be employed. This embodiment provides greater versatility and more convenient servicing than one piece, integral carrier plates permit.

FIG. 7 illustrates a rectangular carrier plate having structural ribs 36 and 38 dividing the framework interior portion into four discrete component receiving portions 40 having arrays of component receiving apertures 24. The carrier plate illustrated in FIG. 7 also includes a continuous groove 48 in the exterior edge 50 of framework perimeter portion 14. Groove 48 is preferably centered in exterior edge 50 between top and bottom surfaces of perimeter portion 14 and extends continuously around the perimeter of carrier plate 10. Groove 48 facilitates handling and processing of components loaded in the carrier plate and permits handling and processing operations in a variety of orientations.

FIG. 8 illustrates a circular carrier plate in accordance with the present invention. The circular configuration also provides a geometry in which there are three or more axes of symmetry in the plane of the framework. Any or all of the attributes of carrier plates of the present invention described herein may be incorporated in circular carrier plates as well. Circular carrier plate 101 illustrated in FIG. 8 also includes a plurality of symmetrically spaced recesses 52 in the exterior edge 50 of framework perimeter portion 141. Recesses 52 are preferably centered in exterior edge 50 between top and bottom surfaces of perimeter portion 141 and are spaced regularly and symmetrically. Recesses 52 are provided to facilitate handling and processing of components loaded in the carrier plate and permit handling of the carrier plate in a variety of orientations.

In addition to recesses 52 in exterior edge 50 of perimeter portion 14, carrier plates of the present invention may be provided with plate handling means 54 in one or both of the surfaces 56 of perimeter portion 14. Such plate handling means 54 are illustrated as recesses in FIGS. 1 and 6. Any combination of recesses and/or projections may be utilized for purposes of aligning the carrier plate in a loading, handling or processing operation. Any arrangement of plate handling means may be provided, but the plate handling means 54 are preferably symmetrically arranged on the perimeter portion to permit utilization of the plate in more than one orientation.

Yet another improvement of the carrier plate of the present invention involves provision of a central means 60 for alignment and/or warpage correction purposes. Carrier plates may exhibit warpage as a consequence of manufacturing techniques and frequently become warped during usage, resulting in imprecise and nonuniform component handling and processing. FIGS. 9A and 9B illustrate correction of carrier plate warpage using carrier plates of the present invention.

With reference to FIG. 9A, it is obvious that carrier plate 10 is in a warped condition. The warpage may be sufficiently severe to prevent clamps 66 from flattening carrier plate 10 against support plate 64 for handling or processing. Central means 60 such as a bore, recess or the like, cooperates with a warpage rectification pin 72 mounted on or through support plate 64 to correct warpage of carrier plate 10. Rectification pin 72 includes a shaft 70 and a head 78 adapted to be received in central means 60. When central means 60 comprises a through bore, as illustrated, head 78 of rectification pin 72 penetrates the central bore and contacts the underlying surface of the carrier plate 10 to exert pressure on the carrier plate. The head 78 of rectification pin 72 and central bore preferably cooperate such that head 78 passes through the bore in a first orientation, but is precluded from passing through the bore in a second orientation. Various types of keyed arrangements that are known in the art may be utilized in this connection. In a warpage correction operation, rectification pin 72 is translated along its central axis 76 to contact carrier plate 10 to support plate 64. When clamps 66 tighten, carrier plate becomes substantially planar and parallel to support plate 64, as shown in FIG. 9B.

Figure 11:
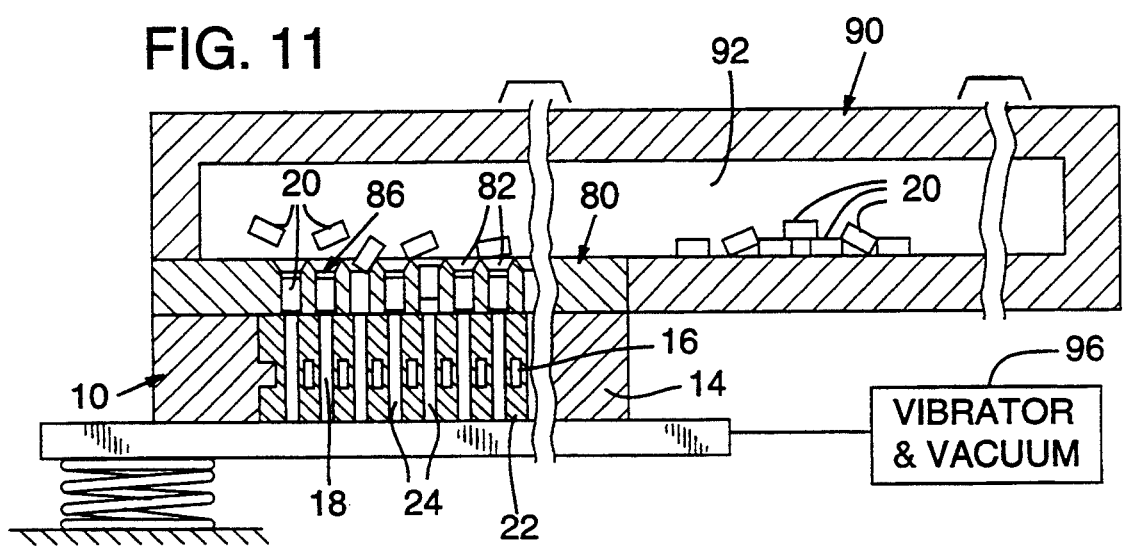
FIG. 11 is an enlarged fragmentary sectional view illustrating electronic components being introduced into a carrier plate through a loading plate.

FIGS. 10 and 11 illustrate an exemplary component loading operation using carrier plates and loading plates of the present invention. Carrier plate 10 has a square configuration with at least three axes of symmetry in the plane of the framework. It otherwise has features as described in connection with FIGS. 3A and 3B. Loading plate 80 has the same general configuration as carrier plate 10, that is, it has at least three axes of symmetry in the plane of the plate. Loading plate 80 also has an array component loading apertures 82 collinear with component apertures 24 of carrier plate 10, and alignment bores 84 collinear with alignment and handling apertures 54 in carrier plate 10.

The cross-sectional configuration of loading plate 80 is shown in detail in FIG. 11 and a preferred embodiment is described more fully in U.S. Pat. No. 4,393,808. In general, loading plate apertures 82 have a tapered portion 86 and have a diameter (or a largest dimension) larger than the largest areal diameter (W) of components 20 along their entire length. Any configuration of loading plate aperture may be incorporated that serves to funnel and direct components 20 into carrier plate 10.

The component loading operation illustrated in FIGS. 10 and 11 utilizes a component reservoir 90 having a hopper cavity 92 for receiving components 20 in bulk. Loading plate 80 and carrier plate 10 are mounted on component reservoir by registration of alignment pin 94 in alignment bores 84 and 54 in loading plate 80 and carrier plate 10, respectively. The assembly is then inverted, as shown in FIG. 11, so that components in hopper cavity 92 are loaded through component loading apertures 82 in loading plate 80 into component apertures 24 in resilient layers 22 of carrier plate 10. Component loading is facilitated by application of vibration and vacuum by source 96.

Having illustrated and described the principles of the invention with reference to several preferred embodiments, it should be apparent to those skilled in the art that the invention may be modified without departing from such principles.

We claim:

1. A carrier plate comprising:
   a generally rigid, planar framework including a perimeter portion, an interior portion, and a structural rib dividing the interior portion into at least two discrete component receiving portions, each of the discrete component receiving portions having multiple component passageways; and
   a layer of resilient material arranged generally parallel to the component receiving portions of the framework, the resilient material having multiple component apertures that are collinear with respect to passageways of the component receiving portions to receive components and resiliently hold them.

2. The carrier plate of claim 1 in which each discrete component receiving portion comprises top and bottom surfaces and at least one of the surfaces is recessed with respect to top and bottom surfaces of the perimeter portion and the structural rib.

3. The carrier plate of claim 1 in which each discrete component receiving portion comprises top and bottom surfaces and a discrete layer of resilient material is arranged generally parallel to and adjacent to at least one of the surfaces.

4. The carrier plate of claim 1 in which the structural rib is collinear with an axis of symmetry of the framework.

5. The carrier plate of claim 1 in which the framework comprises two structural ribs that divide the interior portion into four discrete component receiving portions.

6. The carrier plate of claim 1 in which each of the discrete component receiving portions has the same pattern of component passageways.

7. The carrier plate of claim 1 in which each of the discrete component receiving portions is detachable from the framework.

8. The carrier plate of claim 1 in which the perimeter portion comprises top and bottom surfaces, and a plurality of plate alignment apertures extends from the top surface to the bottom surface of the perimeter portion.

9. The carrier plate of claim 1 in which the framework additionally comprises a central means for receiving a handling pin for connecting warpage of the framework.

10. The carrier plate of claim 1 in which the perimeter portion has a top and bottom surface and an exterior edge between the top and bottom surfaces and a continuous groove is provided in and extends along the length of the exterior edge.

11. A carrier plate comprising:
    a generally rigid, planar framework including a perimeter portion and an interior portion, the interior portion being symmetrically disposed with respect to the perimeter portion and having an array of component passageways and an enlarged central bore; and
    a layer of resilient material arranged generally parallel to the interior portion of the framework, the resilient material having component apertures corresponding to and collinear with corresponding passageways of the interior portion.

12. A carrier plate of claim 11 in which the central bore receives a handling pin for correcting warpage of the framework during handling of the carrier plate.

13. The carrier plate of claim 1 in which the geometric shape is a square.

14. The carrier plate of claim 1 in which the perimeter portion has at least four sides, at least three of the sides being of equal length.

15. The carrier plate of claim 11 in which the geometric shape is a square.

16. The carrier plate of claim 11 in which the perimeter portion has at least four sides, at least three of the sides being of equal length.

17. The carrier plate of claim 11 in which the perimeter portion has top and bottom surfaces, and the interior portion is recessed with respect to at least one of the top and bottom surfaces.

18. The carrier plate of claim 11 in which the interior portion is interposed between two generally parallel layers of resilient material.

19. The carrier plate of claim 11 in which the perimeter portion has top and bottom surfaces and an exterior edge between the top and bottom surfaces, and a continuous groove is provided in and extends along the length of the exterior edge.

20. The carrier plate of claim 11 in which the perimeter portion has top and bottom surfaces and an exterior edge between the top and bottom surfaces, and the exterior edge has a plurality of symmetrically spaced recesses.

21. A non-rectangular carrier plate comprising:
    a generally rigid, planar framework including a perimeter portion and an interior portion, the perimeter portion defining a geometric shape having at least three axes of symmetry in the plane of the framework, and the interior portion having multiple passageways;
    a structural rib that divides the interior portion of the framework into at least two discrete component receiving portions; and
    a layer of resilient material arranged generally parallel to the interior portion of the framework, the resilient material having multiple component apertures collinear with corresponding passageways of the interior portion, the apertures of the resilient material receiving components and resiliently holding them.

22. The carrier plate of claim 21 in which the structural rib is collinear with one of the axes of symmetry and bisects the interior portion.

23. The carrier plate of claim 22 in which the framework comprises two ribs that divide the framework interior portion into four discrete portions having equivalent surface areas.

24. The carrier plate of claim 21 in which at least one face of each discrete portion is recessed with respect to at least one of the top or bottom surfaces of the perimeter portion and the structural rib.

25. The carrier plate of claim 21 in which each of the discrete portions has the same pattern of apertures as the other discrete portions.

26. The carrier plate of claim 21 in which each of the discrete component receiving portions is detachable from the framework.

27. The carrier plate of claim 1 in which the framework comprises spaced parallel plates forming the interior portion, and the resilient layer is positioned between the spaced parallel plates.

28. The carrier plate of claim 21 in which the perimeter portion comprises top and bottom surfaces, and a plurality of enlarged plate alignment apertures extends from the top surface to the bottom surface of the perimeter portion.

29. The carrier plate of claim 21 in which the framework additionally comprises a central means adapted to receive a handling pin for correcting warpage of the framework.

30. The carrier plate of claim 11 in which the multiple passageways in the interior portion are arranged in an array having a perimeter characterized by at least three axes of symmetry in the plane of the interior portion.

* * * * *